United States Patent

D'Haeseleer et al.

[11] Patent Number: 5,859,781
[45] Date of Patent: Jan. 12, 1999

[54] METHOD AND APPARATUS FOR COMPUTING MINIMUM WIRELENGTH POSITION (MWP) FOR CELL IN CELL PLACEMENT FOR INTEGRATED CIRCUIT CHIP

[75] Inventors: Patrik D'Haeseleer, Atherton; Ranko Scepanovic, Cupertino, both of Calif.

[73] Assignee: LSI Logic Corporation, Milpitas, Calif.

[21] Appl. No.: 690,942

[22] Filed: Aug. 1, 1996

Related U.S. Application Data

[63] Continuation of Ser. No. 305,217, Sep. 13, 1994, abandoned.

[51] Int. Cl.[6] ........................................ G06F 17/50
[52] U.S. Cl. .................................... 364/491; 364/490
[58] Field of Search ........................ 364/488, 489, 364/490, 491

[56] References Cited

U.S. PATENT DOCUMENTS

| | | | |
|---|---|---|---|
| 4,577,276 | 3/1986 | Dunlop et al. | 364/491 |
| 4,613,940 | 9/1986 | Shenton et al. | 364/490 |
| 4,777,606 | 10/1988 | Fournier | 364/491 |
| 4,829,446 | 5/1989 | Draney | 364/488 |
| 4,964,057 | 10/1990 | Yabe | 364/491 |
| 5,187,671 | 2/1993 | Cobb | 364/490 |
| 5,224,056 | 6/1993 | Chene et al. | 364/490 |
| 5,224,057 | 6/1993 | Igarashi et al. | 364/490 |
| 5,225,991 | 7/1993 | Dougherty | 364/491 |
| 5,309,371 | 5/1994 | Shikata et al. | 364/491 |
| 5,506,788 | 4/1996 | Cheng et al. | 364/491 |
| 5,587,923 | 12/1996 | Wang | 364/490 |
| 5,636,125 | 6/1997 | Rostoker et al. | 364/468.28 |

OTHER PUBLICATIONS

Banks, John P., *Initial Placement of Gate Arrays Using Least–Squares Methods*, IEEE, Paper 45.1, 1984, pp. 670–671.

Zhang, Xueqing, Pillage, Lawrence T. and Rohrer, Ronald A., *Efficient Final Placement Based on Nets–as–points*, 26th ACM/IEEE Design Automation Conference, Paper 36.2, 1989, pp. 578–581.

Hanan, M., *On Steiner's Problem with Rectilinear Distance*, J. Siam, vol. 14, No. 2, Mar., 1966, pp. 255–265.

Fössmeier, Ulrich, Kaufmann, Michael and Zelikovsky, Alexander, *Faster Approximation Algorithms for the Rectilinear Steiner Tree Problem*, Germany.

Primary Examiner—Kevin J. Teska
Assistant Examiner—Thai Phan
Attorney, Agent, or Firm—Mitchell, Silberberg & Knupp LLP

[57] ABSTRACT

A method and apparatus for positioning a cell in a cell placement for an integrated circuit chip such that a total wirelength for interconnect nets that are connected to said cell is substantially minimum includes constructing bounding boxes around the interconnect nets with the cell excluded respectively. A median interval of the bounding boxes within which the total wirelength is substantially invariant is computed, and the cell is positioned in the median interval. Another optimization methodology, such as for minimizing interconnect congestion, is then applied to compute and position the cell in an optimum location in the median interval.

14 Claims, 5 Drawing Sheets the art of integrated circuits

METHOD AND APPARATUS FOR COMPUTING MINIMUM WIRELENGTH POSITION (MWP) FOR CELL IN CELL PLACEMENT FOR INTEGRATED CIRCUIT CHIP

This application is a continuation of U.S. patent application Ser. No. 08/305,217, filed Sept. 13, 1994, now abandoned.

BACKGROUND OF THE INVENTION

1. Field of the Invention

The present invention generally relates to the art of microelectronic integrated circuits, and more specifically to a method and apparatus for computing a minimum wirelength position (MWP) for a cell in a cell placement for an integrated circuit chip.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including Genetic Algorithm operators such as simulated evolution, or simulated annealing, and comparing the resulting placements using a cost criteria.

A prior art method of minimizing the total wirelength of a net is based on computing a "gravity point" of the pins in the net and moving a selected cell to the gravity point. Typical examples of this method are described in articles entitled "INITIAL PLACEMENT OF GATE ARRAYS USING LEAST-SQUARES METHODS", by J. Banks, 21st Design Automation Conference, 1984, and "Efficient Final Placement Based on Nets-as-points", by X. Zhang et al, 26th ACM/IEEE Design Automation Conference, 1989.

Although the gravity point method is computationally easier to implement than the Steiner tree method, it produces a numerical result consisting of a single point to which a cell is to be relocated. There are often other variables to be considered when determining a new position for a cell, such as the number of interconnects passing through a particular interconnect routing channel. Computation of a single gravity point does not allow these additional variables to be considered when relocating a cell to improve the placement.

SUMMARY OF THE INVENTION

The present invention provides a method and apparatus for positioning a cell in a cell placement for an integrated circuit chip such that a total wirelength for interconnect nets that are connected to said cell is substantially minimum.

The method includes constructing bounding boxes around the interconnect nets with the cell excluded respectively. A median interval of the bounding boxes within which the total wirelength is substantially invariant is computed, and the cell is positioned in the median interval.

Another optimization methodology, such as for minimizing interconnect congestion, is then applied to compute and position the cell in an optimum location in the median interval.

The present method facilitates the combination of two or more optimization methodologies by providing a rectangular range (the median interval) in which the total wirelength is invariant at a minimum value. The other methodologies are then utilized to optimize other variables in the cell placement problem within the range provided by the median interval.

The present method is applicable to constructing Genetic Algorithm operators for chip placement, directed cell placement, and optimal pad positioning.

An apparatus embodying the method advantageously includes a plurality of parallel processors for operating on respective cells simultaneously in parallel.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
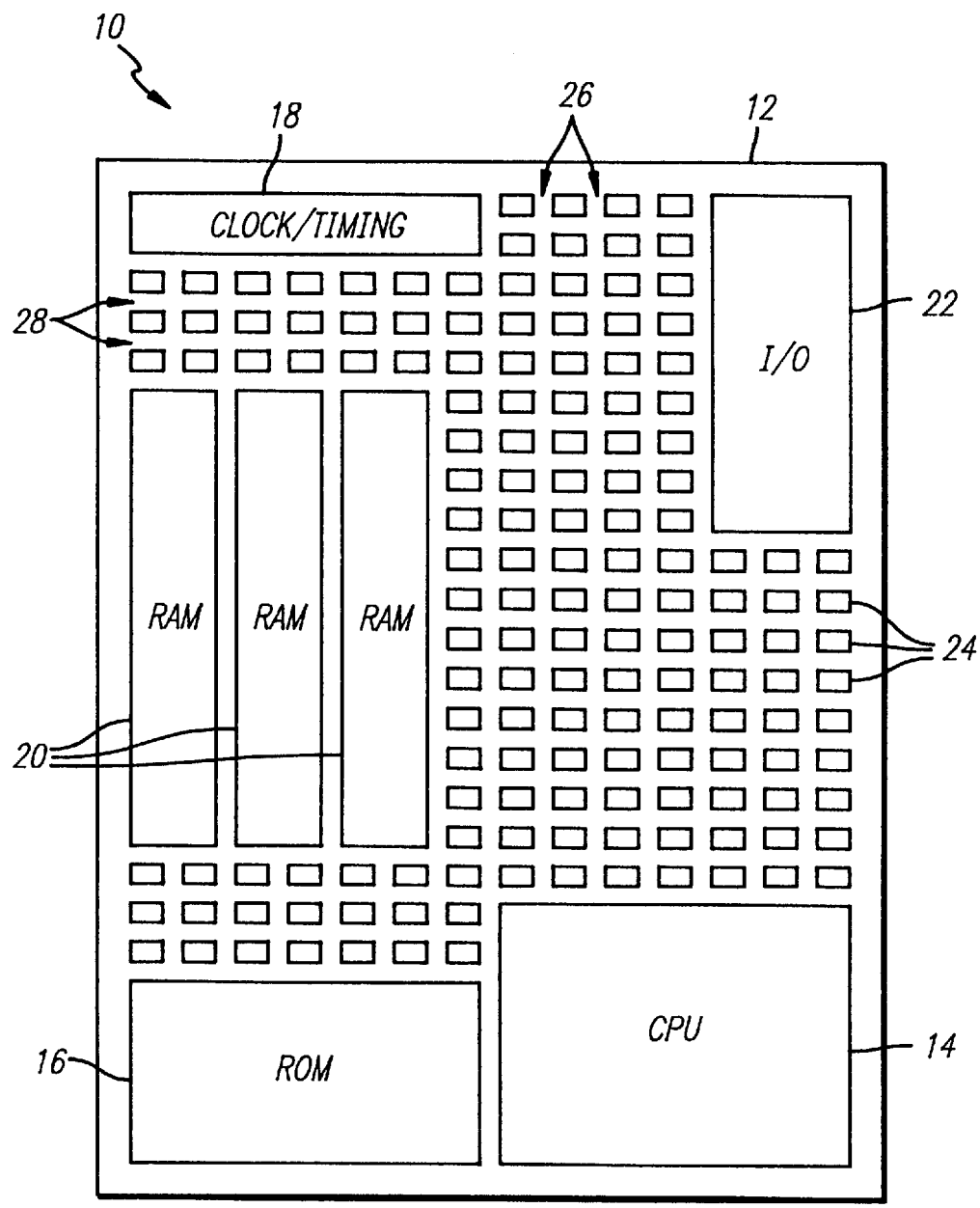
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
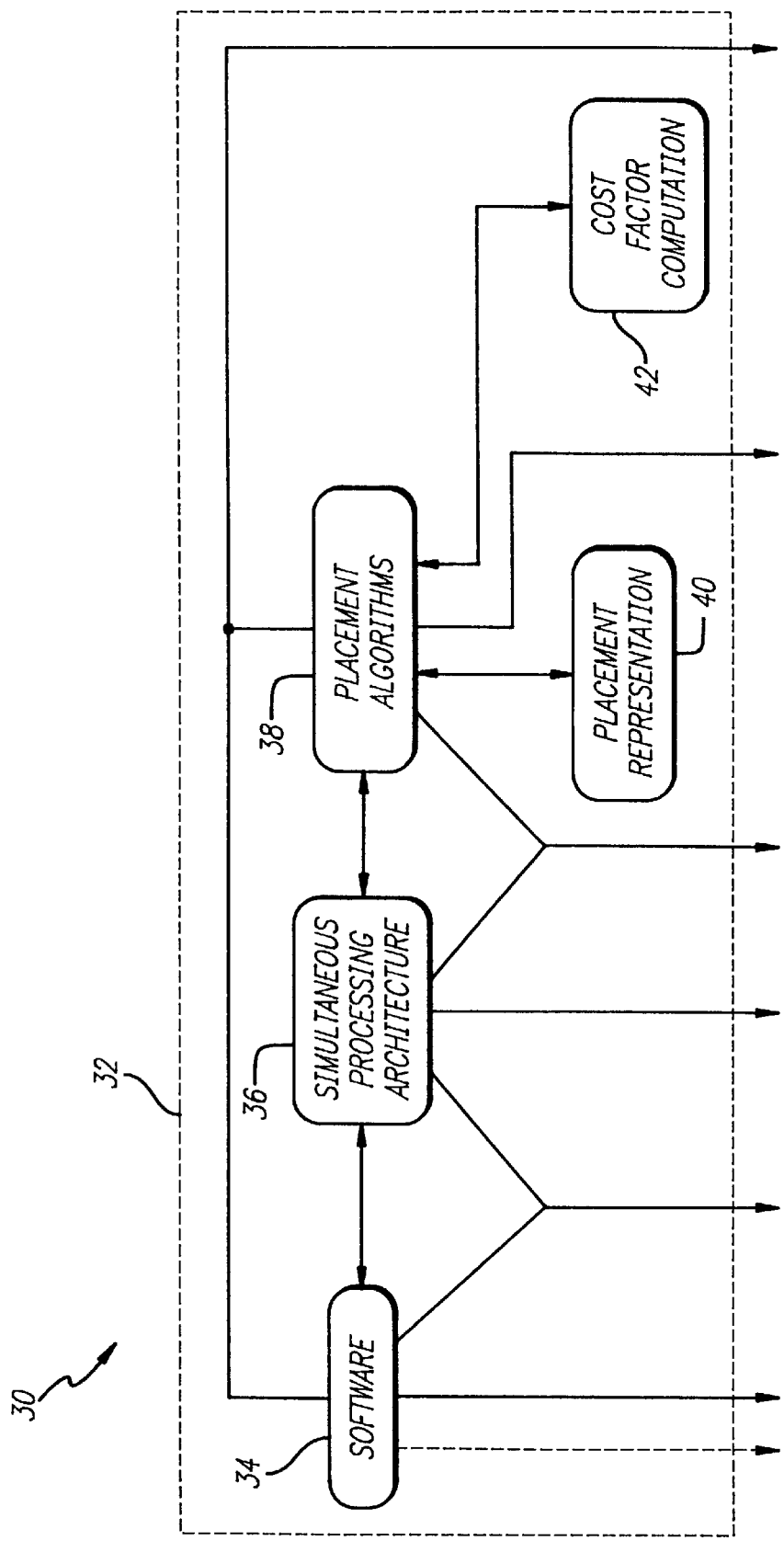
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

The system 30 receives inputs for a user specified integrated circuit design including a netlist, a library of standardized microelectronic elements or cells and functional units including combinations of cells, and a set of rules that define the objectives of the design.

The system 30 decomposes these inputs into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

The present invention provides a method of progressively optimizing a chip placement by improving the placement of cells one by one. Given a placement of cells on a chip, the invention determines the position for a given cell that minimizes the total wirelength for the all interconnect nets attached to that cell. The present method can be used in combination with force directed cell placement, simulated annealing, genetic algorithms, optimal pad positioning or any other suitable methodology.

Figure 3:
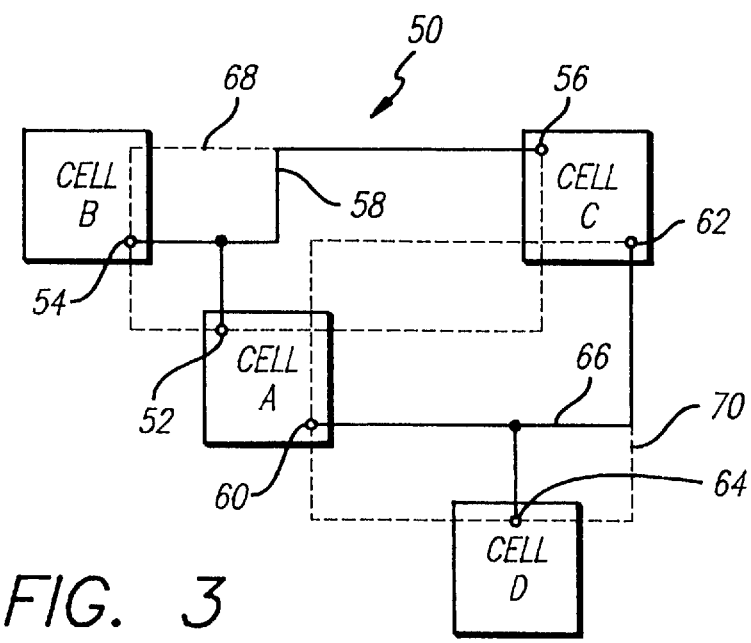
FIG. 3 is a diagram illustrating a first step of the present method that includes constructing bounding boxes around individual interconnect nets of a cell placement.

As illustrated in FIG. 3, a simplified cell placement 50 includes cells A, B, C and D. The cells A, B and C include terminals or pins 52, 54 and 56 that are interconnected by a rectilinear interconnect wire net 58. Similarly, the cells A, C and D comprise pins 60, 62 and 64 that are interconnected by a net 66.

The wirelength for a net is approximated as being equal to half the perimeter of a bounding box around all of the pins to which the net is connected. As illustrated in FIG. 3, the present method includes constructing a bounding box 68 around the pins of the net 58, and a bounding box 70 around the pins of the net 66. The half perimeter of each bounding box 68 and 70 is equal to the sum of the height and width thereof.

Cells to be moved in order to reduce the cost of a placement are selected using, for example, a known simulated annealing algorithm. Given a current position (x,y) of a cell to be moved, and positions $(x_i, y_i)$ for the other cells it is connected to, the total wirelength L(x,y) over all nets connected to the cell at (x,y) is approximated by $$L(x,y) = \sum_i |x - x_i| + |y - y_i| \qquad \text{Equation 1}$$

where x and y are the coordinates of the cell in a coordinate system having axes extending in first and second orthogonal directions. For 2-pin nets, the approximation for wirelength of a net is simply the Manhattan (rectilinear) distance between its 2 pins.

The minimum value of Equation 1 can be calculated by finding values of (x,y) for which the derivative of Equation 1 with respect to x and y goes to zero. Since L(x,y) is independent in x and y, taking the derivative with respect to x and y yields two new formulas from which the optimal x and y position for the cell can be easily calculated. The optimal for a continuous function can be found at those points for which its derivative crosses zero, such that $$\sum_i sgn(x - x_i) = 0 \qquad \text{Equation 2}$$

$$\sum_i sgn(y - y_i) = 0 \qquad \text{Equation 3}$$

where $x \neq x_i$, $y \neq y_i$, $sgn(x-x_i)=+1$ for $(x-x_i)>0$, $sgn(x-x_i)=-1$ for $(x-x_i)<0$, $sgn(y-y_i)=+1$ for $(y-y_i)>0$ and $sgn(y-y_i)=-1$ for $(y-y_i)<0$.

Applying Equations 2 and 3 with combinatorial analysis (where the derivative is not defined for x=xk or y=yl and k and l can be any indices, it can be derived that L(x,y) is minimum if x lies on the median interval of all xi coordinates, and y on the median interval of all yi coordinates.

A median is a value in an ordered set of values below and above which there is an equal number of values, or which is the arithmetic mean of the two middle values if there is no one middle number.

A median interval is the single median point for an odd set of values, or the interval between the two middle values for an even set of values.

If there is an odd number of nets connected to the cell, there will be exactly one (x,y) position (the median for xi and yi). If there are an even number of nets, any x position with an equal number of xi coordinates to the left as to the right will be minimal. The same holds true for the y coordinate.

Figure 4:
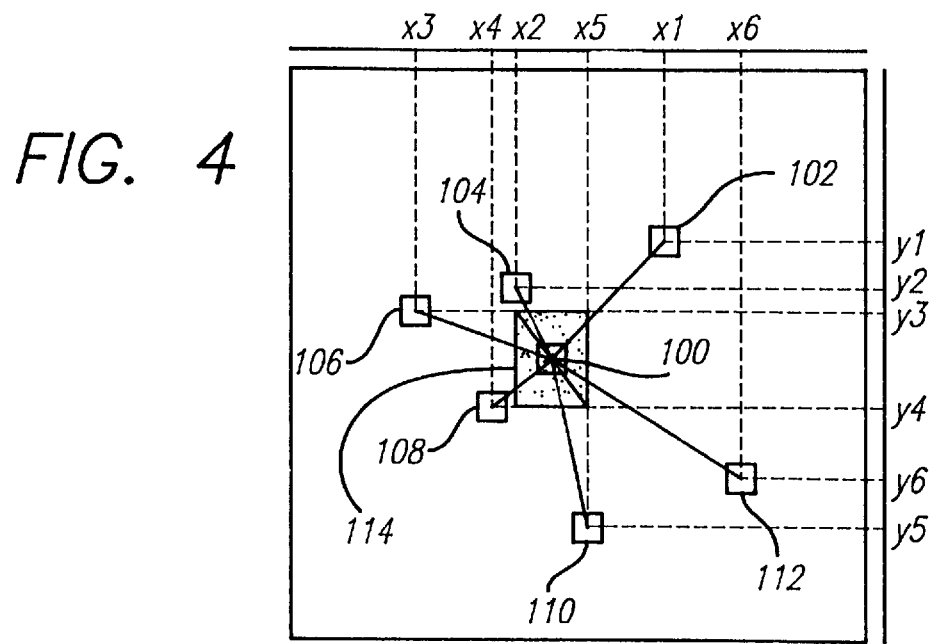
FIG. 4 is a diagram illustrating a median interval for a plurality of two-pin nets.

FIG. 4 illustrates an example for a cell 100 that is connected to six other cells 102 to 112 by respective two-pin nets (not designated). The cells 102 to 112 are located at positions (x1,y1) to (x6,y6) respectively.

The example includes an even number of nets, and the median interval 114 is a rectangle in which the cell 100 can be positioned for minimum total wirelength over all of the nets. There are three cells 104, 106 and 108 on the left side of the median interval 114, whereas there are three cells 102, 110 and 112 on the right side of the interval 114. There are three cells 102, 104 and 106 above the median interval 114, whereas there are three cells 108, 110 and 112 below the interval 114. The median interval 114 provides a minimum wirelength position (MWP) in accordance with the present invention.

The left and right sides of the median interval 114 are defined as being between the coordinates x2 and x5 of the closest left and right cells 104 and 110 respectively. The top and bottom sides of the median interval 114 are defined as being between the coordinates y3 and y4 of the closest top and bottom cells 106 and 108 respectively.

The midpoint of the median interval 114 can be used as the new position for relocating the cell 100. However, since the total wirelength is invariant within the median interval 114, another optimization methodology, such as for minimizing cell interconnect congestion, can be applied to optimally locate the cell 100 at a position within the median interval 114 that optimizes the additional optimization criterion.

Extrapolating from the two-pin net example described with reference to FIG. 4, the minimum wirelength for multi- or N-pin (more than two-pin) nets exists when x is in the median interval of xij coordinates, and y is in the median interval of yij coordinates. The subscript i designates a particular net among a number of different nets connected to a cell. The subscript j can be either "a" or "b", where xia and xib represent the left and right borders, and yia and yib represent the top and bottom borders of a bounding box around the pins of the net i excluding the cell to be relocated or positioned.

Figure 5:
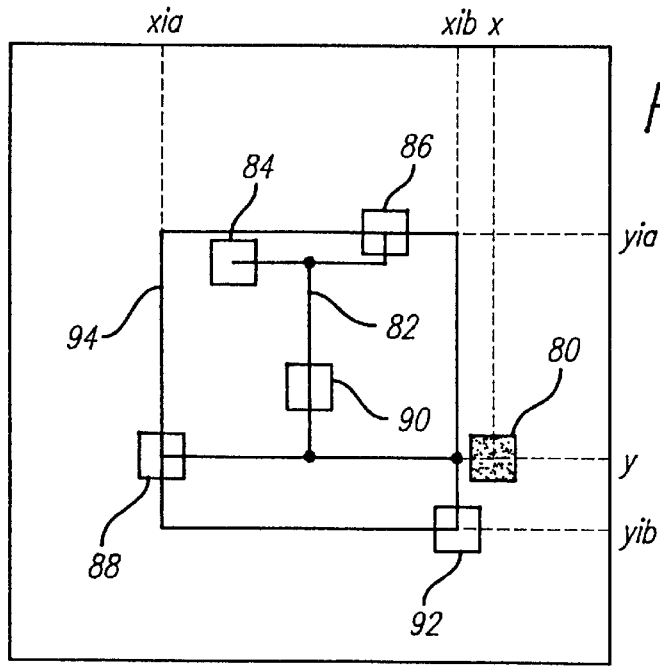
FIG. 5 is a diagram illustrating some properties of computation of wirelength for a single net.

As illustrated in FIG. 5, a cell to be relocated in order to reduce the cost of a placement is designated as 80, and is initially located at x,y. A net i, designated by the reference numeral 82, interconnects pins (not illustrated) of five cells 84, 86, 88, 90 and 92 connected to the cell 80.

A bounding box 94 is constructed around the pins of the cells of the net 82 excluding the cell 80. The left and right borders of the bounding box 94 are designated as xia and xib, whereas the top and bottom borders of the bounding box 94 are designated as yia and yib respectively.

If the cell 80 is moved within the bounding box 94 of the other pins of the net 82, the bounding box 94 for the entire net 82, including the cell 80, and therefore the approximated wirelength, will not change.

As long as the cell is moved within the bounding box (xia, xib, yia, yib) of the other cells connected to net i, the wirelength associated with that net i will stay the same or remain invariant (Li(x,y)=(xib−xia)+(yib−yia)). However, if the cell is moved outside bounding box, the wirelength associated with the net i is determined by the new bounding box.

The total wirelength is the sum of all of these components Li(x,y) over all nets i, and is given as:

$$L(x,y) = \sum_i (\max(xib,x) - \min(xia,x)) + (\max(yib,y) - \min(yia,y)) \quad \text{(Equation 4)}$$

Equation 4 is independent in x and y, so that the optima for L(x,y) can be calculated by determining the values of x and y for which the derivative crosses zero, as follows $$\sum_i \frac{1}{2} \cdot (sgn(x - xia) + sgn(x - xib)) = 0 \quad \text{Equation 5}$$

$$\sum_i \frac{1}{2} \cdot (sgn(y - yia) + sgn(y - yib)) = 0 \quad \text{Equation 6}$$

where x≠xij and y≠yij.

As described above, the resulting optimal values for x and y lie on the median intervals for xij and yij respectively.

Figure 6:
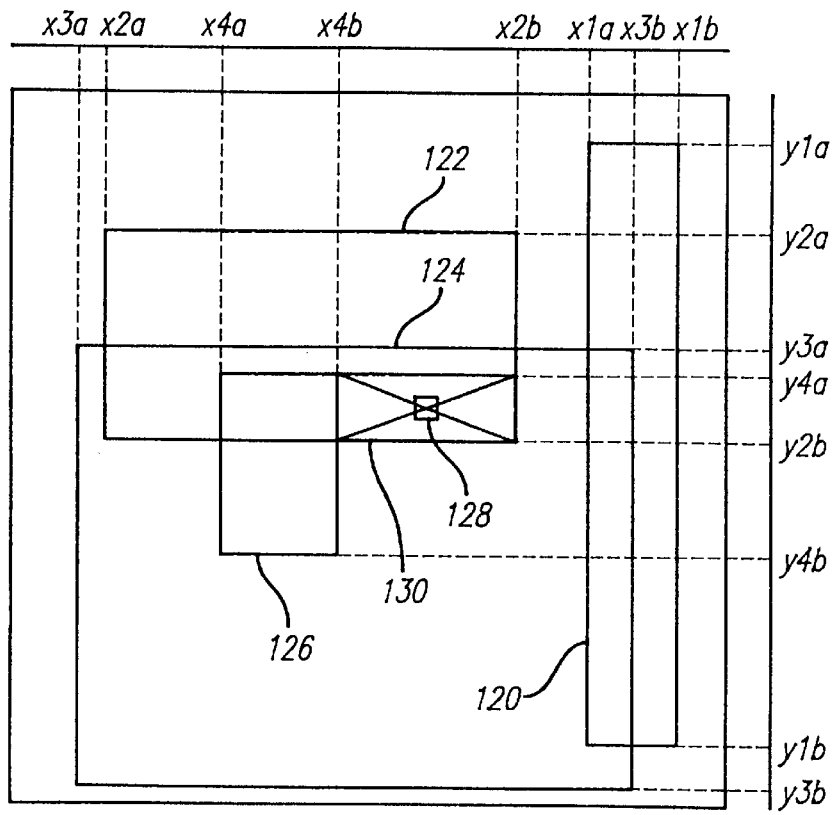
FIG. 6 is a diagram illustrating a median interval for a plurality of N-pin nets.

FIG. 6 illustrates the median interval for four multi-pin nets 120, 122, 124 and 126 that are connected to a cell 128. The nets 120 to 126 have left and right boundaries (x1a,x1b) to (x4a,x4b), and top and bottom boundaries (yia,y1b) to (y4a,y4b) respectively.

The left and right edges or boundaries of a median interval 130 are defined by the boundaries x4b and x2b respectively, such that there are four boundaries x3a, x2a, x4a and x4b to the left of the interval 130 and four boundaries x2b, x1a, x3b and x1b to the right thereof. Similarly, the top and bottom edges or boundaries of the median interval 130 are defined by the boundaries y4a and y2b respectively, such that there are four boundaries y1a, y2a, y3a and y4a above the median interval 130, and four boundaries y2b, y4b, y1b and y3b below the interval 130.

As described above, the total wirelength for all of the nets 120, 122, 124 and 126 is minimum and invariant within the median interval 130. An additional optimization methodology can then be applied to locate an optimal position for the cell 128 within the median interval 130 that satisfies another optimization criterion.

For example, the position within the median interval can be selected to minimize the interconnect wire congestion for an entire placement. The cost of each integrated circuit cell placement can be evaluated by dividing the placement into rectangular areas called switch boxes that surround the cell locations respectively. A bounding box is constructed around each net of a netlist for the placement. A congestion factor is computed for each switch box, for example, as being equal to the number of bounding boxes that overlap the respective switch box.

A cost for the placement and associated netlist is computed as the maximum value, average value, sum of squares or other predetermined function of the congestion factors.

Figure 7:
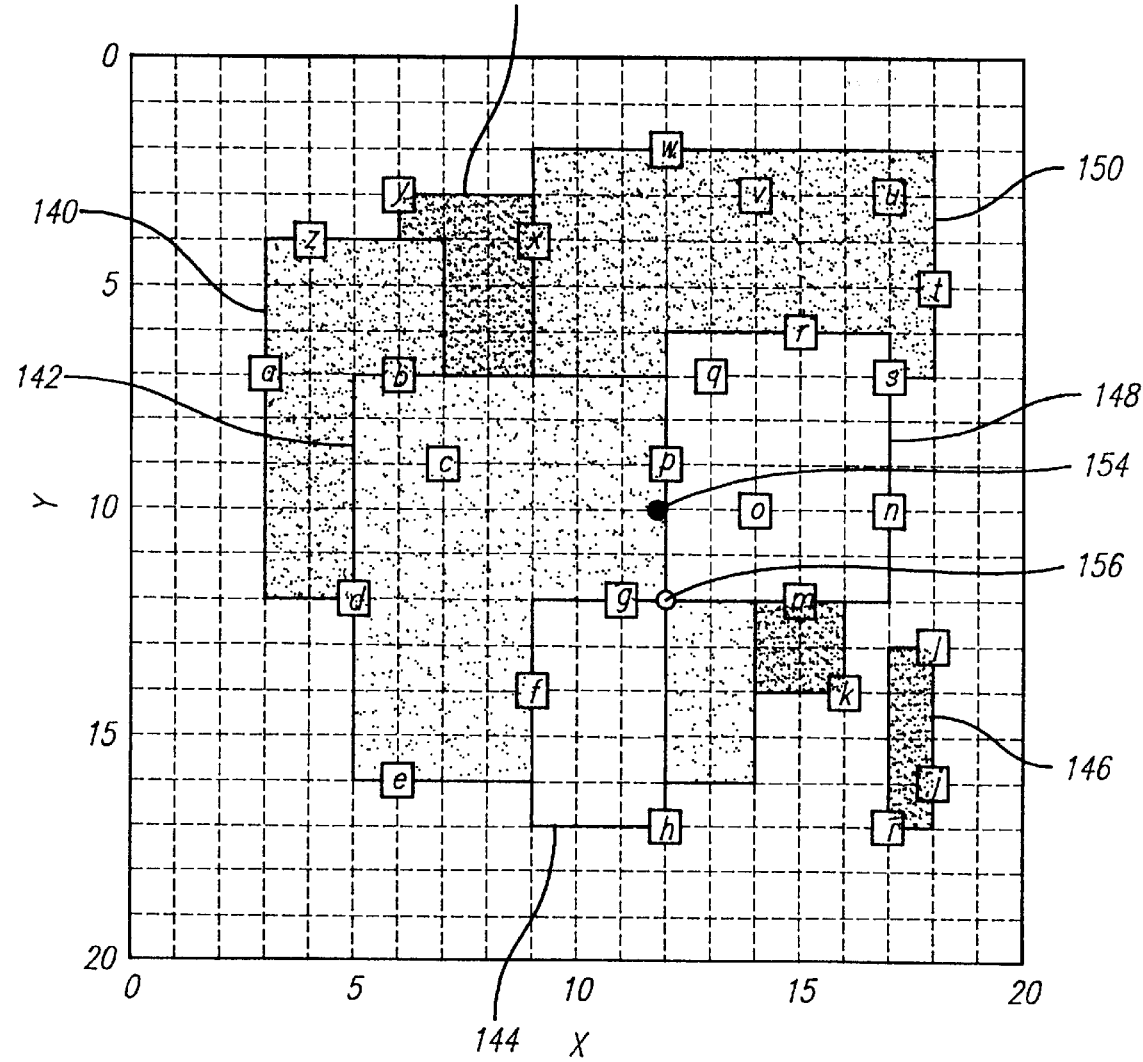
FIG. 7 is a diagram illustrating an example of a median position computed using the present method as compared with a position computed using a prior art gravity point method.

FIG. 7 shows an example of how the present method compares to a gravity point based cell placement methodology. The cell to be placed is connected to seven nets, designated as 140 to 152, including a total of 26 cells that are designated as "a" to "z" respectively. The specific cells in each net are listed in the table below.

The gravity point method was used to calculate the gravity point of each net individually (average position over all cells of the net, excluding the cell to be placed or relocated), and then calculate the overall gravity point as being the average position of all net gravity points. A position 154 found with this method has x,y coordinates of (11.77,10).

The total wirelength after placing the cell in the position 154 is 107.23. A MWP position 156 for the cell using the present minimum wirelength position method was (12,12), and the total wirelength was 105. Because the minimum wirelength position is a single point 156 in this example, all other placements for the cell will have a higher wirelength cost than 105.

TABLE

| Net | Gravity Point | Gravity Point Cost | MWP Cost |
|---|---|---|---|
| net 1: a,b,c,d,z | (5,7.8) | 8.77 + 8 | 9 + 8 |
| net 2: b,d,e,f,o | (8,11.8) | 9 + 9 | 9 + 9 |
| net 3: f,g,h | (10.67,14.33) | 3 + 7 | 3 + 5 |
| net 4: i,j,l | (17.67,15,33) | 6.23 + 7 | 6 + 5 |
| net 5: m,n,p,r,s | (15.2,8.8) | 5.23 + 6 | 5 + 6 |
| net 6: s,t,u,w,x | (14.5,4.2) | 9 + 8 | 9 + 10 |
| net 7: f,k,p,q,v,x,y | (11.29,7.71) | 10 + 11 | 10 + 11 |
| Total | (11.77,10) | 107.23 | 105 |

In summary, the present method facilitates the combination of two or more optimization methodologies by providing a rectangular range (the median interval) in which the total wirelength is invariant at a minimum value. The other methodologies are then utilized to optimize other variables in the cell placement problem within the range provided by the median interval.

The present method can be used in combination with force directed cell placement, simulated annealing, genetic algorithms, optimal pad positioning or any other suitable methodology.

An apparatus embodying the method advantageously includes a plurality of parallel processors as described above with reference to FIG. 2 for operating on respective cells simultaneously in parallel.

Each parallel processor is constructed and/or programmed to perform the functions of a bounder for constructing bounding boxes around the interconnect nets connected to a cell that is to be relocated with the cell excluded respectively, a processor for computing a median interval of the bounding boxes within which the total wirelength is substantially invariant and a positioner for positioning the cell in said median interval.

Various modifications will become possible for those skilled in the art after receiving the teachings of the present disclosure without departing from the scope thereof.

We claim:

1. A method of positioning a cell in a cell placement for an integrated circuit chip such that a total wirelength for interconnect nets that are connected to said cell is substantially minimum, comprising steps of:

(a) constructing bounding boxes around said interconnect nets with said cell excluded respectively;

(b) computing vertical and horizontal median intervals of said bounding boxes within which said total wirelength is substantially invariant; and (c) positioning said cell in said median intervals.

2. A method as in claim 1, in which step (b) comprises computing said median interval as having coordinates x,y in first and second orthogonal directions respectively given by $$\sum_i \frac{1}{2} \cdot (sgn(x - xia) + sgn(x - xib)) = 0$$

$$\sum_i \frac{1}{2} \cdot (sgn(y - yia) + sgn(y - yib)) = 0$$

where i designates said interconnect nets respectively; xia and xib are edges of bounding box for interconnect net i in said first direction; yia and yib are edges of bounding box for interconnect net i in said second direction; $x \neq xia \neq xib$, $y \neq yia \neq yib$; sgn(x-xia), sgn(x-xib), sgn(y-yia), sgn(y-yib) =+1 for (x-xia), (x-xib), (y-yia), (y-yib)>0 respectively; and sgn(x-xia), sgn(x-xib), sgn(y-yia), sgn(y-yib)=-1 for (x-xia), (x-xib), (y-yia), (y-yib)<0 respectively.

3. A method as in claim 1, further comprising the step of:

(d) calculating an optimal position for said cell within said median interval using a predetermined optimization criteria; and (e) moving said cell to said optimal position.

4. A method as in claim 3, in which step (d) comprises calculating said optimal position as corresponding to minimum cell interconnect congestion.

5. A computing apparatus for optimizing a cell placement for an integrated circuit chip such that a total wirelength for interconnect nets that are connected to a cell in said placement is substantially minimum, comprising:

a bounder for constructing bounding boxes around said interconnect nets with said cell excluded respectively;

a processor for computing vertical and horizontal median intervals of said bounding boxes within which said total wirelength is substantially invariant; and a positioner for positioning said cell in said median intervals.

6. An apparatus as in claim 5, in which the processor computes said median interval as having coordinates x,y in first and second orthogonal directions respectively given by $$\sum_i \frac{1}{2} \cdot (sgn(x - xia) + sgn(x - xib)) = 0$$

$$\sum_i \frac{1}{2} \cdot (sgn(y - yia) + sgn(y - yib)) = 0$$

where i designates said interconnect nets respectively; xia and xib are edges of bounding box for interconnect net i in said first direction; yia and yib are edges of bounding box for interconnect net i in said second direction; $x \neq xia \neq xib$, $y \neq yia \neq yib$; sgn(x-xia), sgn(x-xib), sgn(y-yia), sgn(y-yib) =+1 for (x-xia), (x-xib), (y-yia), (y-yib)>0 respectively; and sgn(x-xia), sgn(x-xib), sgn(y-yia), sgn(y-yib)=-1 for (x-xia), (x-xib), (y-yia), (y-yib)<0 respectively.

7. An apparatus as in claim 5, in which:

the processor further calculates an optimal position for said cell within said median interval using a predetermined optimization criteria; and the positioner moves said cell to said optimal position.

8. An apparatus as in claim 7, in which the processor calculates said optimal position as corresponding to minimum cell interconnect congestion.

9. A computing apparatus for optimizing a cell placement for an integrated circuit chip such that total wirelengths for interconnect nets that are connected to selected cells in said placement are substantially minimum respectively, comprising:

a plurality of processing units for simultaneously operating on said selected cells in parallel, each processing unit including:

a bounder for constructing bounding boxes around said interconnect nets with said cell excluded respectively;

a processor for computing vertical and horizontal median intervals of said bounding boxes within which said total wirelength is substantially invariant; and a positioner for positioning said cell in said median intervals.

10. An apparatus as in claim 9, in which the processors compute said median intervals as having coordinates x,y in first and second orthogonal directions respectively given by $$\sum_i \frac{1}{2} \cdot (sgn(x - xia) + sgn(x - xib)) = 0$$

$$\sum_i \frac{1}{2} \cdot (sgn(y - yia) + sgn(y - yib)) = 0$$

where i designates said interconnect nets respectively; xia and xib are edges of bounding box for interconnect net i in said first direction; yia and yib are edges of bounding box for interconnect net i in said second direction; x≠xia≠xib, y≠yia≠yib; sgn(x−xia), sgn(x−xib), sgn(y−yia), sgn(y−yib) =+1 for (x−xia), (x−xib), (y−yia), (y−yib)>0 respectively; and sgn(x−xia), sgn(x−xib), sgn(y−yia), sgn(y−yib)=−1 for (x−xia), (x−xib), (y−yia), (y−yib)<0 respectively.

11. A method of positioning a cell on an integrated circuit (IC) chip to minimize total rectilinear distance to a set of interconnect nets, said method comprising steps of:

constructing rectangular bounding boxes around each of the interconnect nets, each of said bounding boxes having left and right (X-axis) and top and bottom (Y-axis) boundaries;

determining orthogonal positional values of said boundaries of each of the bounding boxes;

determining vertical and horizontal median intervals of said bounding boxes by computing median values of said bounding boxes for each of two orthogonal directions; and positioning the cell in said median intervals.

12. The method of positioning a cell according to claim 11 wherein when the number of interconnect nets is even, said median interval is defined by, for each of the orthogonal directions, the two middle boundary values for that orthogonal direction.

13. The method of positioning a cell according to claim 12 further comprising the step of determining an optimal position for said cell within or on said median interval using predetermined criteria.

14. The method of positioning a cell according to claim 11 wherein when the number of interconnect nets is odd, said median interval is defined by a single point which is the median boundary value of each of the orthogonal directions.

* * * * *